United States Patent

Ernick et al.

[15] 3,648,123

[45] Mar. 7, 1972

[54] EPITAXIAL BASE HIGH-SPEED PNP POWER TRANSISTOR

[72] Inventors: Frederick G. Ernick, Box 288 R.D. 2, Latrobe, Pa. 15650; Thorndike C. T. New, 11020 North 74th Street, Scottsdale, Ariz. 85254; Donald A. Walczak, Box 191 R.D. 2, New Alexandria, Pa. 15670

[22] Filed: Feb. 19, 1970

[21] Appl. No.: 12,712

[52] U.S. Cl. ..............317/235 R, 317/235 AM, 317/235 AJ, 317/235 WW

[51] Int. Cl. ..........................................H01l 9/12, H01l 11/06

[58] Field of Search....................317/235 AM, 235 R, 235 AJ

[56] References Cited

UNITED STATES PATENTS

| | | | |
|---|---|---|---|
| 3,460,009 | 8/1969 | Kisinko | 317/235 |
| 3,460,006 | 8/1969 | Strull | 317/235 |
| 3,427,515 | 2/1969 | Blicher | 317/235 |
| 3,463,681 | 8/1969 | Winstel | 148/187 |
| 3,469,017 | 9/1969 | Starger | 174/52 |

*Primary Examiner*—John W. Huckert
*Assistant Examiner*—Martin H. Edlow
*Attorney*—F. Shapoe and C. L. Menzemer

[57] ABSTRACT

An improved high-speed PNP power transistor, either planar or mesa, comprises at least two epitaxial layers, on a low-resistivity P-type substrate, a first epitaxial layer on the substrate being P-, to provide a collector, and a second epitaxial layer is N-type to provide a base and has an N+ surface layer not exceeding about 1 micron in thickness and of a resistance of about 0.01 ohm-cm., to provide for low saturation, and a P-type emitter laterally contacting or abutting the low-saturation layer, the P-type emitter being either an epitaxially deposited layer to provide a mesa configuration or produced by diffusion through the second epitaxial layer entirely through the saturation surface, in either case to provide a base width of between 1.2 to 4.5 microns.

5 Claims, 9 Drawing Figures

Patented March 7, 1972 3,648,123

2 Sheets-Sheet 1

Figure 1:
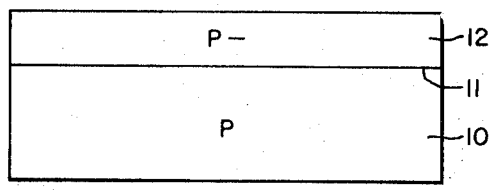

WITNESSES
Theodore F. Wrobel
Donald M. Winegar

INVENTORS
Fredrick G. Ernick, Thorndike C.T. New
and Donald A. Walczak
BY
C. L. Menzemer
ATTORNEY

EPITAXIAL BASE HIGH-SPEED PNP POWER TRANSISTOR

GOVERNMENT CONTRACT RELATIONSHIP OF DISCLOSURE

The invention described herein was made in the performance of work under a NASA contract and is subject to the provisions of Section 305 of the National Aeronautics and Space Act of 1958, Public Law 85-568 (72 Stat. 435; 42 USC 2457).

BACKGROUND OF THE INVENTION

1. Field of the Invention

This invention relates to high speed PNP power transistors and process for producing the same.

2. Description of the Prior Art

It is desirable that high speed PNP power transistors have a low collector to emitter saturation voltage, a high current gain and good secondary breakdown performance. Prior high speed PNP power transistors employed a base region formed by diffusion. A diffused base region has a nonuniform level of impurity concentration and therefore does not have a uniform resistivity.

While epitaxial deposition has been employed to produce transistors, the various techniques employed have resulted in devices with certain shortcomings. Thus, transistors produced by epitaxial processes, as set forth in U.S. Pat. Nos. 3,145,447 and 3,271,208, exhibit properties deficient in one respect or another. Producing a transistor with a doped epitaxial layer may avoid the problem of nonuniformity of impurity doping level in an emitter or base, but this alone does not solve other problems which comprise design configuration.

SUMMARY OF THE INVENTION

In accordance with the teachings of this invention, there is provided a high power, high speed PNP epitaxial transistor either of planar or of mesa configuration with optimized secondary breakdown, current gain and frequency response characteristics comprising (1) a P-type semiconductor substrate which forms one portion of the collector region of the transistor and has a bottom surface to which an ohmic contact is applied, the substrate has a low resistivity below 25 ohm-cm., preferably of the order of 0.10 ohm-centimeter or less and the second portion of the collector is a P-type region epitaxially deposited on the upper surface of the substrate of a thickness of from 15 to 25 microns with a constant level of impurity profile and a resistivity of from about 5 to 25 ohm-centimeters; (2) a 4 to 6 micron thick N-type monocrystalline epitaxial base layer region having a constant level of impurity concentration profile and a resistivity of from about 0.3 to 1.0 ohm-centimeter disposed upon and abutting the top surface of the second portion of a substrate and forming a PN junction therewith, selected portions of the upper surface of the epitaxial base layer being more highly N+ doped to a depth of not over y1 micron to a resistivity of about 0.01 ohm-centimeter or 150 to 350 ohms per square; and (3) a P+ type emitter region with sides disposed to abut edges of the selected portions of the upper s$rface of the base layer while the bottom surface of the emitter contacts the upper surface of the N-type epitaxial base region to form a PN junction with the base width of about 1.2 to 4.5 microns. The P+ type emitter may be formed by diffusion or be an epitaxial layer of a thickness of 0.9 to 3.3 microns. Ohmic contacts are applied to the emitter and to the more highly N+ doped selected portions of the base layer.

Figure 6:
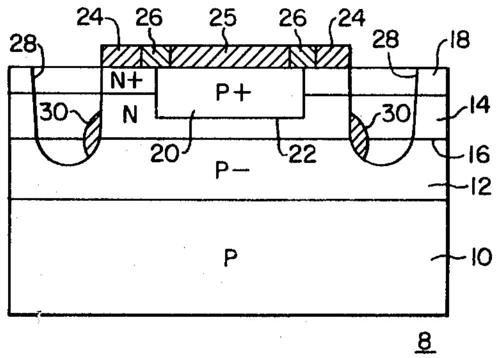
Figure 7:
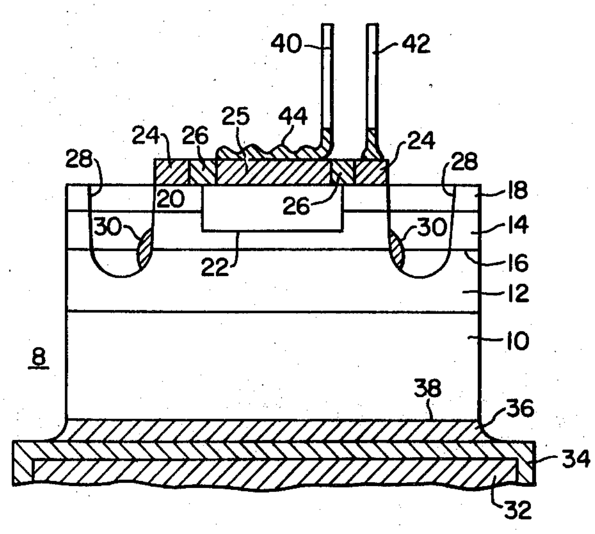
Figure 8:
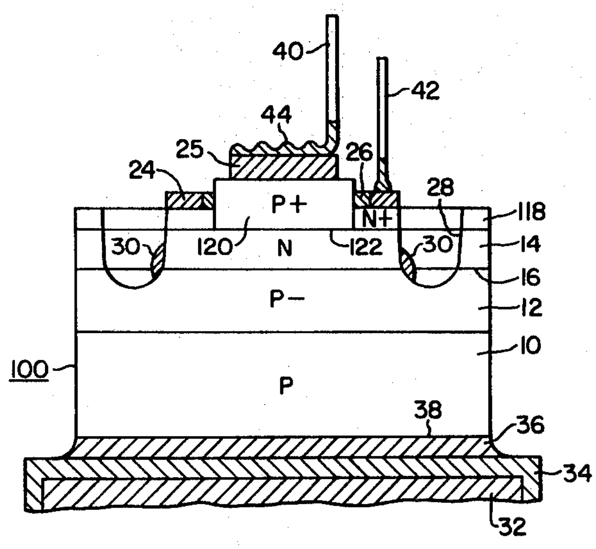
Figure 9:
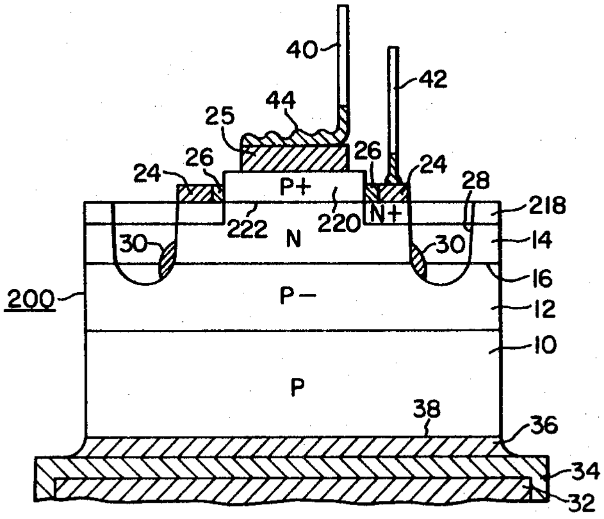

FIGS. 1 through 7 are cross-sectional views of a body of semiconductor material being processed in accordance with the teachings of this invention to provide a planar device; and FIGS. 8 and 9 are cross-sectional views of a mesa-type of transistor embodying the invention.

DESCRIPTION OF THE INVENTION

The collector region of a high power (greater than 100 watts output) PNP transistor of this invention achieves high lifetime characteristics which enable the transistor to function as a high voltage power transistor with high usable current gain, good saturation voltage and good frequency response. The collector region preferably is formed of two distinct portions wherein the upper portion is epitaxially produced and is in contact with an overlying epitaxial base region to form a PN junction, has a resistivity much greater than the lower portion of the collector which will usually comprise a silicon wafer substrate. The upper portion of the collector should have a substantially constant impurity concentration profile whereas the lower portion of the collector region may have either a graded or a substantially constant impurity profile.

In the PNP high speed high power transistor, the collector region of the transistor should be of P-type semiconductivity. The substrate has two opposed major surfaces and preferably the semiconductor material comprising the substrate is a silicon wafer suitably doped with P-type dopant to a desired level of resistivity of less than 25 ohm-centimeters, and preferably below 0.1 ohm-cm. Silicon wafers of this degree of P-type semiconductivity are commercially obtainable today and have lifetime characteristics and a lower amount of imperfections than is usually obtainable by epitaxial growth techniques.

A layer of P-type semiconductivity having a resistivity higher than the substrate, preferably from 25 to 5 ohm-cm., is grown epitaxially as a monocrystalline layer of suitably uniformly doped semiconductor material, such for example, as P-silicon if the substrate be silicon, on the top major surface of the substrate.

With reference to FIG. 1, there is shown a body 10 of semiconductor material with an epitaxial layer 12 which forms the collector region. The body 10 may comprise any semiconductor material suitable for making a PNP power transistor. However, silicon is preferred because it has excellent all around physical and electrical characteristics which are desirable to fulfill predetermined parameters. The body 10 should have a low resistivity that is less than 25 ohm-centimeter, and preferably 0.1 ohm-cm and less. Excellent results have been obtained with commercially available silicon wafers of a resistivity of 0.01 ohm-centimeter.

Since the body 10 will undergo several high temperature process steps, it is desirable that the body 10 and its dopant be thermally stable, and preferably have a low diffusion constant. Boron is a suitable P-type impurity material having a low diffusion constant for silicon. The employment of a boron doped silicon wafer for body 10 reduces out-diffusion during any subsequent epitaxial growth process step which is practiced. Optimally the body 10 preferably comprises a P-type semiconductivity boron-doped silicon semiconductor wafer having a resistivity of about 0.1 ohm-centimeter or less of any suitable thickness, for example 5 mils.

A region 12 of P-type semiconductivity silicon is epitaxially grown on a surface of the body 10 by any suitable means as is well known to those skilled in the art. The P-region 12 has a resistivity of from about 5 ohm-centimeter to 25 ohm-centimeter and is the basic portion of the collector region of the power device since it supports almost all of the sustaining voltage of the power transistor. The region 12 is from 15 to 25 microns in thickness. For a high speed power transistor having a sustaining voltage of about 250 volts, the region 12 preferably has a resistivity of from 20 to 25-ohm centimeter. As an illustrative example, the region 12 is 20 microns in thickness and has a resistivity of 11 ohm-centimeter.

The parameters set forth for the region 12 are a compromise between several factors. For breakdown voltage purposes between the collector and the base of a device embodying the body 10, the resistivity of the region 12 should be as high as possible and the thickness of the region 12 should be as thick as possible in the range given. However, for good saturation voltage requirements, the resistivity should be as low as possible and the region 12 should be as thin as possible. Additionally, to achieve the greatest gain for a device one also wants the region 12 to have as low a resistivity as possible as well as a thickness which is as thin as possible. Within the thickness and resistivity limits given, epitaxial portion 12 can meet any reasonable compromise of characteristics needed.

For a high speed high power transistor it is desirable that for a sustaining voltage of 90 volts for the collector the maximum collector-emitter voltage for the transistor should be 150 volts and the gain should be 20 at a 20-ampere collector current for a collector saturation voltage of less than 1 volt.

By forming the region 12 by epitaxial growth a sharply defined junction 11 will be secured between the region 12 and the body 10. An epitaxial grown region 12 provides an immediate high level of impurity concentration as this PP— junction which enables the completed device to have a high gain. The impurity concentration gradient is greater at a stepped junction than at a graded junction. A diffusion process will not provide a sharply defined junction and the net effect is similar to the presence of a higher resistivity region and the gain of the final device is lower. During the epitaxial growth, the impurity such as boron, can be introduced uniformly into the growing material and the resulting region 12 is uniformly doped throughout, that is, it has a substantially constant impurity concentration profile throughout the region 12.

Alternatively, the preferred constant impurity concentration profile throughout the region 12 is also obtainable by employing commercially available silicon 3 to 7 mil thick wafers, meeting the resistivity requirements of region 12 as a starting substrate. Silicon meeting the requirements of the body 10 is then epitaxially grown on a surface of the region 12 after suitable surface preparation. However, the wafer must then be etched to reduce the layer 12 to the 15 to 25 micron thickness. This may be a difficult problem. Diffusing P-type dopant into a wafer forming the region 12 substrate by diffusion to obtain a region meeting the requirements of the body 10 is difficult, and of course a sharp PP— junction is not produced.

The preparation of the surface of the body 10 upon which the region 12 is to be epitaxially grown becomes increasingly important as the sustaining voltage of the high speed power transistor of this invention is increased. Below about 200 volts sustaining, a high speed power transistor embodying the conventional material surface preparation of the body 10 followed by an epitaxial growth process which includes in situ gaseous etching of the body 10 followed by the epitaxial growth of the region 12 in one continuous material growth process appears to be acceptable.

Unexpectedly it has been found that in a PNP-transistor configuration, the impurity concentration in the P-layer 12 of the collector region can be greater than the impurity concentration in the N-layer of the collector region of an NPN transistor. For example, in an epitaxial base high speed, high power transistor of an NPN configuration, the collector region corresponding to the P-collector region of a PNP configuration has an impurity concentration of $6\times10^{14}$ atoms/cc. and supports a sustaining voltage, $V_{CEO}$ of 120 volts. In the P-region of the collector of the PNP high speed, high power transistor of this invention the impurity concentration is now greater than before, being $2\times10^{15}$ atoms/cc., yet the PNP transistor supports 120 volts $V_{CEO}$ sustaining while the other electrical parameters for both type transistors are the same. This is contrary to prior art teachings that an increase in resistivity decreases the breakdown voltage for the transistor. Therefore, it has been the accepted belief, which was followed in practice, that with a decrease in the impurity concentration of the portion of the collector region corresponding with the P-region of the device of this invention, one would increase the theoretical avalanche breakdown voltage of the high speed, high power transistor.

Figure 2:
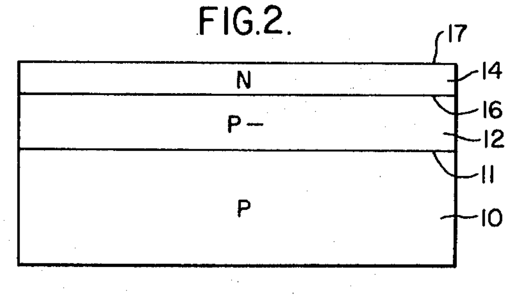

Referring now to FIG. 2, a base region 14 of N-type semiconductivity silicon semiconductor material with a top surface 17 is epitaxially grown on the region 12 of P-type material. A PN-junction 16 is formed at the interface between the regions 12 and 14. The thickness and the resistivity of the region 14 are predetermined to control the "punch-through" of an electrical device embodying the body 10. For a high speed, power transistor made in accordance with this invention with a sustaining voltage of approximately 200 volts, the region 14 is from about 4 to 6 microns in thickness and has a resistivity of from about 0.3 to 1.0 ohm-centimeter. Preferably the region 14 has a resistivity of 0.5 ohm-centimeter and a thickness of 5 microns for a sustaining voltage of approximately 200 volts.

The base resistivity is designed so that with the base width employed, the device embodying the body 10 is punch-through rather than avalanche limited. Punch-through limited devices have been observed experimentally to have better secondary breakdown performance. The high base resistivity also increases the emitter efficiency and consequently the gain of the device.

The region 14 must be an epitaxially deposited region because epitaxial growth imparts desirable electrical characteristics to the material grown that cannot be attained by diffusion techniques to form the base region 14. This great improvement occurs for reasons that are not understood.

Additionally, it has been found that although a fast slitching power transistor may have either (1) a diffused basic collector region, a base region diffused into the basic collector region, and an emitter diffused into the base region, or (2) an epitaxially grown basic collector region, a base region and an emitter region diffused in the basic collector region, or (3) an epitaxially grown basic collector region, a base region epitaxially grown on the collector region and an emitter region diffused into the base region, or (4) an initial substrate forming at least the basic collector region, a base region epitaxially grown on the basic collector region, and an emitter region diffused into the base region, and all four transistors have apparently essentially similar configurations, but the power transistors having an epitaxially grown base region as in (3) or (4) will have faster switching speeds in comparison to devices with base regions formed by diffusion in (1) and (2). This faster switching speed is believed to be the result of a more uniform impurity concentration profile within the base region thereby permitting less storage time of the carriers to occur within the base region 14.

Figure 3:
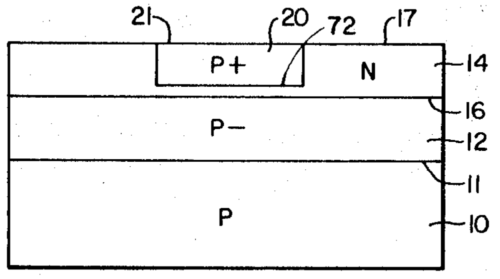

Referring now to FIG. 3, an emitter region 20 is formed in the base region 14. The region 20 is of P-type semiconductivity. The region 20 has a top surface 21 which is contiguous with and substantially in the same plane as the top surface 17 of the region 14. The region 20 may be formed by such suitable techniques as a diffusion process or an epitaxial growth process, either of which includes protective oxide coating of surface 17, photolithographical masking techniques and selective etching techniques to remove the oxide at surface 21 and then either diffusing a P doping impurity through exposed surface 21, or etching away the silicon to plane 72 and epitaxially filling the depression with P-type doped silicon.

The emitter region 20 will have an emitter edge whose length will vary in accordance to the desired amperage rating for the transistor made in accordance with the teachings of this invention. In order to achieve the desired edge length, a digitated configuration is often employed.

The body 10 as processed with the structure as shown in FIG. 3 and including the etching and the protection of exposed portions of the PN-junction 16 as shown in FIGS. 6 and 7 with a protective coating 30 is sufficient to act as a high speed high power transistor. However, it has been discovered that although the same structure also produces saturation voltages for the power transistor which may be acceptable, the saturation voltage characteristics of the transistor may be improved upon, with improved secondary breakdown characteristics of the power transistor as well.

To achieve the improvement in the saturation voltage and secondary breakdown voltage characteristics of a power transistor made in accordance with the teachings of this invention, a surface layer of N+ type conductivity semiconductor material is provided about emitter region 20. This N+-type region has a lower resistivity than the region 14 and abuts and contacts the side surfaces of emitter region 20 forming a PN junction therebetween which is an extension of the PN-junction 22 between regions 14 and the bottom surface of region 20. This N-type surface region has a level of impurity concentration which makes it N+ conductivity relative to the conductivity of the main body of region 14.

Figure 4:
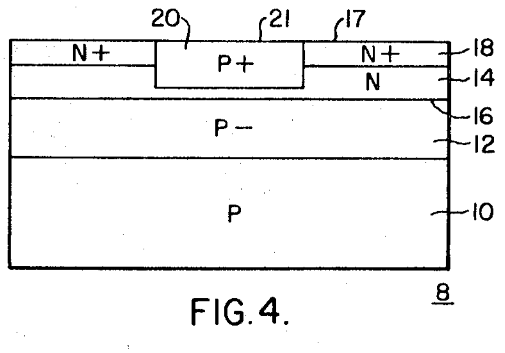

With reference to FIG. 4, to illustrate the structure after processing the body of FIG. 2 to include the N+ region, a surface layer 18 of N+ type semiconductivity is produced either by diffusing additional N dopant within, or epitaxially growing a more highly N-doped layer on the region 14. The N+ layer 18 has a sheet resistivity of from 150 to 350, or about 0.01 ohm-cm., and an impurity concentration greater than $5\times10^{18}$ atoms per cm.$^3$. The layer 18 functions to reduce the collector-emitter saturation voltage by reducing the base spreading resistance. The thickness of the layer 18 is no greater than one micron and may be down to less than 0.1 micron, with a thickness of approximately 0.3 micron being preferred.

The layer 18 can be formed on the entire top surface of region 14 before the emitter 20 is formed. The layer 18, produced either by diffusion of a dopant or exitaxial growth of an N+ layer less than 1 micron in thickness, on the top surface of layer 14. When the layer 18 is no more than approximately 1 micron in thickness, a satisfactory emitter region can be obtainable through the selective diffusion process, through the layer 18 into the region 14 and the power transistor embodying this process technique is capable of operating at an emitter base voltage of from 5 volts to 10 volts and still have the desirable high gain.

With reference to FIG. 4, to produce a region 20 of P+ type semiconductivity in the region 14 there may be employed suitable processes known to those skilled in the art, such, for example as an oxidation process followed by photolithographic, selective etching and diffusion techniques of body 8. A diffusion process embodying $B_2H_6$ as the source of boron impurity is preferred since high deposition surface concentrations of the boron of approximately $6\times10^{19}$ atoms per cubic centimeter is desired to secure a maximum emitter efficiency in order to obtain a high gain. This preferred doping concentration enables one to obtain a preferred PN-junction 22 depth of from 0.9 to 3.3 microns from surface 21, based on the diffusion time and the thickness of the base region 14 with the region 20 having a sheet resistivity of less than 3 ohms per square. A PN-junction 22 is formed at the interface between the regions 20 and 14 thereby providing a base width "$t$" which measures from 1.3 to 4.5 microns. If the base width "$t$" is greater than 4.5 microns, the breakdown voltage and the secondary breakdown voltage is increased but the gain of a transistor so prepared drops rapidly with even small increases so as to render it far less desirable for applications as a high speed, high power transistor. If the base width "$t$" is less than 1.3 microns, the reverse shortcomings take effect.

The processed body 8 of FIG. 4 enables one to obtain collector-emitter saturation voltages as low as those achieved with prior art devices having the region 14 formed by selective diffusion of the region 20 into the epitaxially grown region 14. However, the region 14 of this invention has a constant resistivity gradient that cannot be achieved by diffusion. Thus the processed body 10 of this invention has the good secondary breakdown voltage performance of a single-diffused transistor as well as all of the desirable frequency response benefits achieved by epitaxially formed transistors.

A comparison of high speed power transistors made in accordance with the teachings of the invention and having the basic transistor structure as shown in FIGS. 3 and 4 show the transistor having the basic structure of FIG. 4 to have the far lower saturation voltage. For example, high speed power transistors having the basic structure of FIG. 3 had a saturation voltage of approximately 2 volts for a collector current of 20 amps. High speed power transistors having the basic structure of FIG. 4 at a collector current of 20 amps had a saturation voltage of no greater than 1 volt.

The better secondary breakdown performance of high speed power transistor embodying the basic transistor configuration of body 8 as shown in FIG. 4 as compared to one having the basic configuration as shown in FIG. 3, may be explained as follows: when electrical contacts are affixed to the base and emitter regions of the transistors and current is caused to flow in the transistors, the greatest amount of thermal energy is produced in the transistor of the basic structural configuration of FIG. 3 and results in the poor secondary breakdown characteristics of the transistor structures. In the transistor having the structure of FIG. 3, the current flowing from the base contact to the emitter-base junction 22 must flow through high resistivity base region 14. The greater the resistivity of region 14, the more thermal energy the transistor produces accompanied by a decrease in the secondary breakdown characteristic of the transistor. This is of concern to one employing the transistor since the thermal stability of the transistor may be effected enough to cause the transistor to run away electrically. This may occur when the current of the transistor increases rapidly, thereby resulting in burnout and complete failure of the transistor.

On the other hand, the introduction of the N+ region 18 in the basic high speed power transistor configuration of FIG. 4 introduces a region of low resistivity in the base region of the transistor. In the basic transistor structure of body 8 of FIG. 4, the current flowing from the base contact to the emitter-base junction 22 flows through a lower resistivity region, region 18, than in the structure of FIG. 3. The resistivity of region 18 being lower, the same current employed in the transistor of the structure of FIG. 4 produces less thermal energy than it would in the transistor of the structure of FIG. 3. The result is that the transistor having the basic structure of FIG. 4 is more thermally stable and has a better secondary breakdown characteristic than that of FIG. 3.

Figure 5:
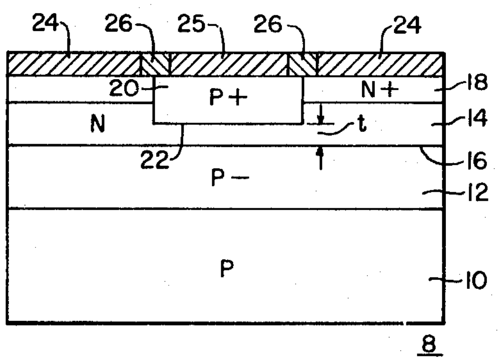

Referring now to FIG. 5, a layer 26 of an electrically insulating material such as for example as an oxide, a carbide or a nitride is formed over the junctions between the regions 18 and 20. Suitable materials include silicon oxide, silicon carbide, silicon nitride and a mixture of silicon oxide-silicon nitride. This can be produced by initially covering all the surfaces 17 and 21 with an oxide or other inorganic insulator. Employing photolithographic techniques and selective etching processes all of the layer 26, except for the selected areas at the exposed surface PN junction, is removed. A layer 24 and 25 of aluminum or other ohmic contact metal is applied to the exposed surfaces 17 of the regions 18 and exposed surfaces 21 of region 20, respectively by any suitable means known to those skilled in the art such, for example, as by evaporation in a vacuum evaporation chamber. The layers 24 and 25 are from 10,000 A. to 60,000 A. in thickness with 40,000 A. being preferred. If necessary, employing photolithographic techniques, inverse contact masking and chemical etching processes, any excess aluminum is removed from the body 8, particularly any disposed upon the portions of the layer 26 so as to electrically insulate the layer 24 from layer 25 of metal disposed on the different regions 18 and 20 from each other. The body 8 is then placed in a suitable furnace and heated to 570° C. for approximately 2 minutes to alloy the aluminum to the surfaces 17 and 21 of the respective regions 18 and 20.

Referring now to FIG. 6 there is shown a preferred embodiment after treatment of the body 8. Employing suitable means, such, for example as an ultrasonic cavitation followed by chemical etching, a peripheral isolation groove 28 is formed within the upper surface of the body 8. The groove 28 extends downwardly from the top surface of the region 18 at least past the PN-junction 16 and into the region 12. Among the several purposes that the groove 28 serves is its establishment of a reliable collector to base voltage and collector to emitter voltage. After etching, the walls of the groove 28 are smooth and minimize the current leakage across the PN junction 16.

Additionally, in subsequently soldering a backup electrode to the bottom surface of the body 8, the solder employed to join the electrode to the body 8 has a tendency to ascend the side surfaces of the body 8 as a result of capillary action and electrically short-circuiting the PN junction 16 if it were not for the isolation groove 28. An additional protection for the exposed portions of the PN-junction 16 where it intersects the inner surface wall of the groove 28 is the application of a layer 30 of a protective coating material, such, for example, a cured resinous material comprising a mixture of alizarin and a silicone polymer.

Referring now to FIG. 7, the processed body 8 is affixed to a suitable collector backup electrode, or contact member, 32 by a solder 36. The electrode 32 comprises any suitable metal such, for example, as molybdenum, tungsten, tantalum, and combinations and base alloys thereof. Good results are obtained if the electrode 32 has a layer 34 of gold disposed on its surfaces. The gold layer 34 enables one to employ a solder with a melting temperature of less than about 570° C. to affix the electrode 32 to the processed body 8. Usually a solder alloy melting at about 900° C. is employed to join an unplated electrode 32 to silicon semiconductor materials. However, in this instance the presence of the layer 24 of aluminum necessitates the use of a lower melting temperature solder alloy. Preferably a layer 36 of a suitable solder alloy having a melting temperature of from 300° C. to no more than 570° C. such, for example, as a gold-silicon alloy solder, joins the gold-plated electrode 32 to the polished bottom surface 38 of the body 8. The solder layer 36 must be substantially free of voids otherwise during the operation of a device embodying the processed body 8 "hotspots" may occur which may cause a premature failure by the secondary breakdown voltage.

Electrical leads 40 and 42 are affixed to the layers 24 and 25 of the respective regions 20 and 14 by any suitable means. The leads 40 and 42 comprise such suitable electrically conductive metals as aluminum, gold and silver. Preferably the leads 40 and 42 have a rectangular cross section to enable one to affix them to the layer 24 of aluminum by a preferred ultrasonic bonding technique.

In high-frequency transistor devices, it is very desirable that the transistor be capable of turning on fast. To enable the transistor to turn on fast, there must be a good electrical current distribution over the entire emitter area in as little time as possible. Preferably, therefore, one end 44 of the lead 40 forms a large area electrical contact to the layer 24 of the region 20. This enables one to distribute the electrical current of the lead 40 over a large surface area of the region 20 in a very short time interval.

High speed power transistors made in accordance with the teachings of this invention are also suitable for use in compression bonded encapsulated electrical devices.

Alternate embodiments of the high speed power transistor of this invention are shown in FIGS. 8 and 9. Referring now to FIG. 8 there is shown a semiconductor element 100 which is the same as the processed body 10 of semiconductor material except for the formation of the N+ region and the P+ region. In the element 100 a N+ region 118 is grown epitaxially on the region 14 as part of the continuous epitaxial growth process which may be employed to produce the regions 12 and 14. A layer of silicon oxide is grown on the N+ region 118 and employing photolithographical techniques and selective etching a window is opened through the oxide layer and the N+ region 118 to expose the region 14. A P+ region 120 is then grown on the oxide layer and the exposed surface of the region 14 thereby establishing a PN-junction 122 between regions 14 and 118 and 120. Again employing photolithographical techniques and selective etching the unwanted portions of the grown P+ material and the silicon oxide are removed. The element is completed in the same manner as before as shown in FIG. 8.

Referring to FIG. 9 there is shown still another alternate embodiment of the process body 10 in which a semiconductor element 200 is the same as the processed body 10 except an emitter region 220 is grown epitaxially on the region 14 thereby forming PN-junction 222. Employing photolithographical techniques diffusion, masking techniques and selective etching a region 218 of N+ conductivity is formed in the region 14 immediately about the region 220. The regions 218 and 220 have the same parameters as the regions 18 and 20 of the processed body 10. The element 200 is completed in the same manner as described heretofore for the processed body 10.

The following examples are illustrative of the teachings of this invention:

EXAMPLE I

Two high power, high speed power transistors having a PNP configuration and an epitaxial base were made in accordance with the teachings of this invention. Each of the power transistors had a structure comprising a substrate of P-type semiconductivity silicon semiconductor material boron doped, and having a resistivity of 0.01 ohm-centimeter and a thickness of approximately 15.0 microns. The first epitaxial layer was of P-type semiconductivity silicon having a thickness of 20 microns and a resistivity of 20 ohm-centimeters. The substrate and the first epitaxial layer formed the collector region of the transistor. The P-type dopant was derived from $B_2H_6$. On the epitaxial portion of the collector region an epitaxial base region of silicon of a thickness of 5.7 microns was grown and had N-type semiconductivity, a resistivity of 1 ohm-centimeter and a constant impurity profile. An N+ surface layer was then epitaxially grown on the top surface of the base region, the layer being 0.3 micron in thickness and having a resistivity of 0.01 ohm-centimeter. An emitter was diffused through the N+ region and formed into the epitaxial N-type base region by boron diffusing through the top surface of the epitaxial N+ base layer to form the emitter having P+ type semiconductivity. The first transistor was diffused for 10 minutes to produce an emitter having a junction depth of 0.9 microns thereby resulting in a base width of about 3.9 microns. The second transistor underwent a 20-minute boron diffusion resulting in an emitter junction depth of 2.1 microns and a base width of about 3.0 microns. In each instance the doping concentration was $6\times10^{19}$ atoms per cubic centimeter. The backup electrode for each power transistor was made of molybdenum and the electrical contacts to the base and emitter regions were each aluminum. The protective coating on the exposed portion of the collector-base junction consisted of a silicone polymer.

Each of the power devices were tested electrically, and the results are tabulated in Table I.

TABLE I

| Test conditions | $V_{CB}=50$ v. | $V_{EB}=5$ v. | IC=200 ma. $R_{BE}=50$ ohms | $I_C=$-a. $I_B=$-a. | $V_{CE}=5$ v. $I_C=5$ a. | $V_{CE}=5$ v. $I_C=10$ a. | $V_{CE}=10$ v. $I_C=30$ a. at 20 mcs. | |
|---|---|---|---|---|---|---|---|---|
| Parameters | $I_{CBO}$ | $I_{EBO}$ | $V_{CER}$(sns) | $V_{CE}$(sat) | $h_{FE}$ | $h_{FE}$ | $h_{FE}$ | $F_t$ |
| Units | Ma. | Ma. | V. | V. | | | | Hz. |
| Transistor: | | | | | | | | |
| 1 | 0.01 | 3.5 | 250 | 1.7 | 11 | 5 | | 20 |
| 2 | 0.005 | 0.6 | 210 | 1.3 | 50 | 16 | 3.5 | 30 |

The result of the electrical tests showed the transistors to have a low saturation voltage [$V_{CE}$(sat)] which is desirable since it represents a loss of power for each transistor. The transistors had a frequency response time ($F_t$).

In comparing the secondary breakdown capability of PNP high speed, high power transistors made in accordance with the teachings of this invention with prior art NPN high speed, high power transistors of similar design, it has been found that the PNP transistors have the higher secondary breakdown capability and better secondary breakdown performance even though each of the transistors have a base region of the same width, the constant level of impurity concentration and the same manufactured base width.

In addition to these numerous other transistors to be prepared are found to meet all the desirable requirements previously set forth herein.

We claim as our invention:

1. A semiconductor high power, high speed PNP transistor comprising:

a collector region comprising a first portion of P-type semiconductor material having two opposed major surfaces comprising a top surface and a bottom surface and having a predetermined resistivity of 25 ohm-centimeter or less, and a second portion of P-type semiconductor material having two opposed major surfaces comprising a top surface and a bottom surface, the bottom surface of said second portion being joined to the top surface of the first portion, the second portion having a predetermined resistivity of from 5 to 25 ohm-centimeter, a predetermined thickness of from 15 to 25 microns, and a substantially constant level of impurity concentration profile, the resistivity of said second portion being greater than the resistivity of said first portion, at least the second portion being an epitaxially deposited layer, an epitaxial base region layer comprising N-type semiconductor material having a bottom surface disposed on the top s$rface of the second portion of the collector region and forming a PN junction therewith, said base region having a predetermined resistivity of from about 0.3 to 1 ohm-centimeter and a thickness of from about 4 to 6 microns, and a constant level of impurity concentration profile, a predetermined area of the top surface portion of the N-type base region comprising a thickness of no greater than 1 micron being doped to a sheet resistivity of from 150 to 350 ohms per square to provide for low saturation, and a base ohmic contact applied to the low saturation predetermined area of the top surface portion of the base region, an emitter region comprising P-type semiconductor material having a bottom surface disposed to contact the 0.3 to 1 ohm-centimeter portion of the base region and side surfaces extending to abut and contact the low saturation surface portion of the base region and forming second PN junction therewith and providing a base width of from 1.2 to 4.5 microns, and an ohmic contact applied to the emitter, and, an ohmic contact applied to the first portion of the collector region.

2. The semiconductor transistor of claim 1 in which the emitter region is a diffused portion within the epitaxial base region and has a P-type impurity concentration of approximately $6\times10^{19}$ atoms per cubic centimeter and is of a thickness of from 0.9 micron to 3.3 microns.

3. The semiconductor transistor of claim 2 in which said first portion of said collector region has a resistivity of about 0.01 ohm-centimeter;

said second portion of said collector region has a resistivity of about 11 ohm-centimeter and a thickness of about 20 microns;

said base region has a resistivity of about 0.5 ohm-centimeter and a thickness of about 5 microns; and said base width is about 2 microns.

4. The semiconductor transistor of claim 1 in which the emitter is a P-type epitaxial layer deposited on the base region to provide a mesa configuration, the bottom surface of the P-type epitaxial layer forming a PN junction with the base region, and the sides of the epitaxial emitter layer extending to and being in contact with the low saturation predetermined surface portion of the base region throughout the periphery of the P-type emitter epitaxial layer.

5. The semiconductor transistor of claim 2 wherein:

an annular groove, completely encircling the emitter is disposed within the outer periphery of the top surface of the base region, said groove having a bottom surface and sidewalls, said bottom surface being disposed within said collector region, and said sidewalls extending upwardly from the bottom surface through said collector region, and across said collector-base PN junction.

* * * * *